(12) United States Patent
DiStefano

(10) Patent No.: US 7,078,819 B2
(45) Date of Patent: Jul. 18, 2006

(54) MICROELECTRONIC PACKAGES WITH ELONGATED SOLDER INTERCONNECTIONS

(75) Inventor: Thomas H. DiStefano, Monte Sereno, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 09/854,269

(22) Filed: May 11, 2001

(65) Prior Publication Data

US 2001/0020748 A1 Sep. 13, 2001

Related U.S. Application Data

(62) Division of application No. 09/157,047, filed on Sep. 18, 1998.

(60) Provisional application No. 60/059,225, filed on Sep. 18, 1997.

(51) Int. Cl.
*H01L 23/48* (2006.01)
*H01L 23/52* (2006.01)
*H01L 29/40* (2006.01)

(52) U.S. Cl. .................. 257/779; 257/772; 257/778

(58) Field of Classification Search ................ 257/778, 257/669–674, 772, 779
See application file for complete search history.

(56) References Cited

U.S. PATENT DOCUMENTS

| | | | |
|---|---|---|---|
| 3,509,270 A | 4/1970 | Dube et al. | |
| 3,616,532 A | 11/1971 | Beck | |
| 4,245,273 A | 1/1981 | Feinberg et al. | |
| 4,545,610 A * | 10/1985 | Lakritz et al. | ................ 29/589 |
| 4,581,680 A * | 4/1986 | Garner | ...................... 361/403 |
| 4,642,889 A | 2/1987 | Grabbe | |
| 4,664,309 A | 5/1987 | Allen et al. | |
| 4,705,205 A | 11/1987 | Allen et al. | |
| 4,967,950 A | 11/1990 | Legg et al. | .................. 228/180 |
| 5,075,965 A * | 12/1991 | Carey et al. | .................. 29/840 |
| 5,130,779 A | 7/1992 | Agarwala et al. | ............. 357/67 |
| 5,148,265 A | 9/1992 | Khandros et al. | ............. 357/80 |
| 5,148,266 A | 9/1992 | Khandros et al. | ............. 357/80 |
| 5,148,968 A | 9/1992 | Schmidt et al. | .......... 228/180.2 |
| 5,385,291 A | 1/1995 | Latta | ..................... 228/180.22 |
| 5,455,390 A * | 10/1995 | DiStefano et al. | .......... 174/262 |
| 5,499,312 A * | 3/1996 | Hahn et al. | ..................... 385/91 |
| 5,509,203 A * | 4/1996 | Yamashita | ................... 29/879 |
| 5,518,964 A | 5/1996 | DiStefano et al. | .......... 437/209 |
| 5,578,869 A * | 11/1996 | Hoffman et al. | ............ 257/691 |

(Continued)

FOREIGN PATENT DOCUMENTS

DE 3736671 * 6/1989

(Continued)

OTHER PUBLICATIONS

Marshall et al., 1991, IEEE, 41st Electronic Components and Technology Conference, pp. 647-652.*

(Continued)

*Primary Examiner*—Mary Wilczewski
*Assistant Examiner*—Monica Lewis
(74) *Attorney, Agent, or Firm*—Lerner, David, Littenberg, Krumholz & Mentlik, LLP

(57) ABSTRACT

A soldered assembly for a microelectronic element includes a microelectronic element, solder columns extending from a surface of the microelectronic element and terminals connected to distal ends of the columns. The assembly can be handled and mounted using conventional surface-mount techniques, but provides thermal fatigue resistance. The solder columns may be inclined relative to the chip surface, and may contain long, columnar inclusions preferentially oriented along the lengthwise axes of the columns.

6 Claims, 4 Drawing Sheets

U.S. PATENT DOCUMENTS

| | | | |
|---|---|---|---|
| 5,597,469 A * | 1/1997 | Carey et al. | 205/118 |
| 5,688,716 A | 11/1997 | DiStefano et al. | 437/182 |
| 5,798,286 A | 8/1998 | Faraci et al. | 438/113 |
| 5,950,073 A * | 9/1999 | Griffen, IV et al. | 438/119 |
| 5,968,670 A * | 10/1999 | Brofman et al. | 428/576 |
| 6,114,187 A * | 9/2000 | Hayes | 438/106 |
| 6,215,196 B1 | 4/2001 | Eldridge et al. | |
| 6,286,206 B1 * | 9/2001 | Li | 29/840 |
| 6,369,451 B1 | 4/2002 | Lin | |

FOREIGN PATENT DOCUMENTS

| | | | |
|---|---|---|---|
| EP | 0191434 A2 * | 7/1986 | |
| GB | 2177643 A * | 1/1987 | |
| JP | 2-295699 * | 5/1989 | |
| WO | WO 97/40958 | 11/1997 | |

OTHER PUBLICATIONS

Marshall et al., 1997, MCB University Press, Soldering and Surface Mount Technology, vol. 9 No. 2, pp. 1-24.*

K. Himrichsmeyer and E.E. Stadler, Solder-Filled Elastomeric Spacer, IBM Technical Disclosure Bulletin, vol. 27, No. 8, Jan. 1985.

Daryl Ann Doane, Paul D. Franzon (editors), Multichip Module Technologies and Alternatives: The Basics, (1993).

Annonymous, Flip Chip Technology, 1994 Update US Patents, International Interconnection Intelligence, pp. 4-2 reporting IBM Technical Disclosure Bulletin, vol. 36, No. 1, p. 174, Jan. 1993.

* cited by examiner

MICROELECTRONIC PACKAGES WITH ELONGATED SOLDER INTERCONNECTIONS

CROSS-REFERENCE TO RELATED APPLICATIONS

This is a divisional of U.S. patent application Ser. No. 09/157,047, filed Sep. 18, 1998, the disclosure of which is hereby incorporated by reference herein. Said '047 application claims benefit of U.S. Provisional Patent Application 60/059,225, filed Sep. 18, 1997, the disclosure of which is hereby incorporated by reference herein.

BACKGROUND OF THE INVENTION

Microelectronic elements such as semiconductor chips have been connected to circuit panels by soldering. One technique which has been utilized heretofore is referred to as "flip chip" bonding. In flip chip bonding, the front surface of the chip bearing the contact pads of the chip faces downwardly, towards the surface of a circuit panel having a pattern of pads matching the pattern of the contact pads on the chip. The pads on the chip are bonded to the mating pads on the substrate. In one variant of this technique, referred to as a "controlled collapse chip connection" or "C4" bond, individual masses of solder are provided on the contact pads of the chip or substrate prior to assembly. In the assembly process, these masses are reflowed by bringing them to an elevated temperature sufficient to melt or partially melt the solder constituting the masses. The assembly is then cooled, leaving each contact pad on the chip connected to the corresponding contact pad on the circuit panel by a mass of solid solder. As described, for example, in *Multi-Chip Module Technologies And Alternatives: The Basics, Doane and Franzon, Editors* (1993), pp. 468–471, surface tension in the molten solder tends to form each solder mass into a generally barrel-shaped object having narrow neck portions at the junctures between the solder masses and the contact pads on the chip and circuit panel.

The solder bonds in such assemblies typically are subjected to thermal fatigue stress during manufacture and during use of the assembly. The electrical power dissipated within the chip and other elements of the assembly tends to heat the chip and the circuit panel, so that the temperatures of the chip and circuit panel rise and fall depending on use of the device. Processing operations during manufacturing also cause the temperature of the assembly to rise and fall. As the chip and substrate ordinarily are formed from different materials having different coefficients of thermal expansion, the chip and the circuit panel ordinarily expand and contract by different amounts. Even where the chip and circuit panel are formed from materials having the same coefficients of thermal expansion, differential expansion and contraction still can occur because the elements of the assembly tend to heat and cool at different rates. For example, the temperature of the chip typically increases more rapidly than the temperature of the circuit panel when power is first applied to the chip. Differential expansion and contraction causes the contact pads on the chip to move relative to the contact pads on the substrate, which in turn tends to strain the solder bonds. The barrel-shaped solder bonds resulting from conventional C4 bonding techniques are susceptible to failure under these conditions. In particular, the narrow necks of the solder masses interfaces with the contact pads, produce stress concentrations at highly stressed regions of the solder bonds.

As described in the aforementioned Doane and Franzon treatise, attempts have been made to alleviate these problems by changing the shapes of the solder masses so as to provide elongated solder masses having narrow sections midway between the contact pads of the chip and circuit panel. As described, for example, in Lakritz et al., U.S. Pat. No. 4,545,610 and Agarwala, et al., U.S. Pat. No. 5,130,779, elongated solder columns can be formed by using multiple solder masses stacked above one another with separate elements to maintain the chip and circuit panel at the desired spacing during the reflow process. As described in Schmidt, et al., U.S. Pat. No. 5,148,968 and Latta, U.S. Pat. No. 5,385,291, elongated solder columns can also be made by pulling the chip and circuit panel away from one another while the components are at an elevated temperature in the reflow operation. The Latta '291 patent suggests that the step of moving the elements of the assembly be conducted under an elevated pressure applied by increasing the atmospheric pressure around the assembly which allegedly results in a different wall configuration.

Other assemblies incorporating elongated solder columns are disclosed in Flip Chip Technology 1994 Update U.S. Patents, International Interconnection Intelligence, pp. 4-2 reporting IBM Technical Disclosure Bulletin, Vol. 36, No. 1, p. 174, January 1993; in IBM Technical Disclosure Bulletin, Vol. 27, No. 8, January 1985 entitled Solder-Filled Elastomeric Spacer; and in U.S. Pat. Nos. 4,581,680 and 4,967, 950.

Chip mounting procedures using elongated solder columns heretofore have suffered form considerable drawbacks. These procedures require specialized techniques and considerable care during mounting of the chip to the circuit panel. Moreover, these procedures require handling and testing of bare, unpackaged semiconductor chips. It is difficult to test such a bare chip prior to attachment of the chip to the circuit panel. Moreover, the bare chip is susceptible to damage during handling and testing.

As shown in the preferred embodiments of commonly assigned U.S. Pat. Nos. 5,148,265; 5,148,266; 5,455,390, 5,518,964 5,688,716 and 5,798,286 as well as in co-pending, commonly assigned U.S. patent applications Ser. No. 08/653,016 filed May 24, 1996; Ser. No. 08/678,808 filed Jul. 12, 1996, the disclosures of which are all incorporated by reference herein, it is desirable to provide interconnections between the contacts on a chip and external circuitry by providing a further dielectric element, commonly referred to as a "interposer" or "chip carrier" having terminals. The dielectric element is juxtaposed with the chip and the terminals on the dielectric element are connected to the contacts on the chip, desirably by flexible leads extending between the interposer and the chip. The terminals on the dielectric element may be connected to a substrate such as a circuit panel, as by solder bonding the terminals to contact pads of the substrate. The dielectric element remains movable with respect to the chip so as to compensate for thermal expansion and contraction of the components. That is, various parts of the chip can move with respect to the dielectric element and with respect to the terminals on the dielectric element, as the components expand and contract. In a particularly preferred arrangement, a compliant dielectric layer is incorporated in the dielectric element or provided as a separate component so that the compliant layer lies between the chip and the terminals. The compliant layer may be formed from a material such as a gel, elastomer, foam or the like. The compliant layer mechanically decouples the dielectric element and terminals from the chip and facilitates movement of the dielectric element and terminals relative to the chip. The compliant layer may also permit movement of the terminals in the Z direction, towards the chip, which further facilitates testing and mounting of the assembly. Thus, differential thermal expansion and contraction of the circuit panel and chip does not cause fatigue failures of the solder bonds. In a variant of this approach, disclosed in commonly assigned PCT International Publication WO 97/40958, the disclosure of which is also incorporated by reference herein, the terminals on the interposer can be connected to the contacts of the chip by masses of a low-melting electrically conductive composition which liquefies at the temperatures attained during service. The compliant layer retains the liquid in place, so that masses of conductive liquid provide deformable connections between the chip and interposer. As further disclosed in these patents and patent applications, one or more chips may be mounted to a common dielectric element or interposer, and additional circuit elements may also be to such a dielectric element. The dielectric element may incorporate conductive traces which form interconnections between the various chips and electronic components of the assembly and which completes circuits as required.

In these techniques, the assembly of the chip and the interposer, with the terminals thereon provides a packaged chip which can be handled, tested and assembled readily. The most preferred packaged chips can be assembled to a circuit board using standard surface mount soldering and other standard techniques. The preferred embodiments according to the aforementioned commonly assigned patents and patent applications disclosing interposers also provide highly reliable assemblies. These techniques are being increasingly adopted in the electronic industry. However, it would be desirable to provide still further techniques and assemblies to provide an even greater versatility.

SUMMARY OF THE INVENTION

One aspect of the invention provides methods of making solder interconnections. A method in accordance with this aspect of the invention includes the step of providing first and second elements having confronting surfaces and having pads on the confronting surfaces arranged in pairs, each such pair including a pad on the first element and a pad on the second element as well as solder masses at at least some of the pairs, so that each such solder mass is provided in contact with both pads of the pair. The method further includes the step of moving the elements in a vertical direction away from one another while the solder masses are at a temperature above the recrystallization temperature of the solder constituting the masses. The moving step desirably is performed by introducing a fluid under pressure between the confronting surfaces to thereby move the elements away from one another and stretch the solder masses. The moving step can be performed in whole or in part while the solder masses are at a temperature above the recrystallization temperature but below the solidus temperature of the solder masses; or while the solder masses are in a partially liquid state, at a temperature between the solidus and liquidus temperatures of the solder masses; or while the solder masses are at a temperature above the liquidus temperature. As used in this disclosure, the term "solidus temperature" means the highest temperature at which the solder, in equilibrium, is entirely solid, whereas the term "liquidus temperature" means the lowest temperature at which the solder in equilibrium is entirely liquid.

In a particularly preferred method according to this aspect of the invention, the first element includes a dielectric packaging structure having an interior surface facing toward the second element and having an exterior surface. The pads of the first element are disposed on the interior surface. The packaging structure further includes terminals exposed at the exterior surface which are electrically connected to the pads on the interior surface. Desirably, the second element includes one semiconductor chip or a plurality of semiconductor chips. Preferred methods according to these embodiments of the invention, thus can provide packaged microelectronic elements, such as packaged semiconductor chips, incorporating the microelectronic element and an interposer having terminals connected to the microelectronic element by elongated solder columns. Such an assembly can be utilized by bonding the terminals of the interposer to a circuit panel or other substrate. The assembly can be handled and mounted using standard techniques. The elongated solder columns provide enhanced resistance to stress as compared to standard flip-chip mountings, but without the need for special techniques during assembly of the chip to the circuit panel.

Methods according to this aspect of the invention desirably include the step of injecting a liquid material around the solder masses and curing the liquid to form dielectric encapsulant, desirably a compliant encapsulant, surrounding the elongated solder columns. For example, the fluid used to force the elements away from one another may be a liquid, uncured encapsulant. Where the second element includes a plurality of chips, the method may include the step of separating the chips from one another after the step of moving the elements away from one another, and desirably after cooling the solder masses to below their solidus temperature. The dielectric packaging structure or interposer may be severed in this separating step. The separating step forms a plurality of unit assemblies, each of which includes one or more of the chips and a portion of the packaging structure or interposer associated with such chip or chips. For example, the method may be performed at a wafer level, with a large interposer covering the entire wafer. The interposer and the wafer may be severed to provide unit assemblies. The first element used in the process may include a reinforcing element engaged with the first element. This approach is particularly useful where the first element is a flexible dielectric element such as a packaging structure. For example, the packaging structure may be held taut on a frame extending around the periphery of the packaging structure. Alternatively or additionally, the reinforcing element may extend along the exterior of the packaging structure. The method desired further includes the steps of at least partially removing the reinforcing structure after the moving step. The reinforcing structure holds the pads of the packaging structure precisely in position and facilitates registration of the packaging structure with the pads of the microelectronic elements. This is particularly useful where the process is performed on a wafer level.

A further aspect of the present invention provides methods of making solder connections which include the steps of providing first and second elements having confronting surfaces and having pads on the confronting surfaces arranged in pairs, each pair including a pad on one element and a pad on the other element, and providing solder masses at at least some of the pairs so that each such solder mass is in contact with both pads of the pair. Methods according to this aspect of the invention also include the step of moving the elements away from one another through a preselected vertical movement so as to stretch the solder masses while the solder masses are at a temperature above the recrystallization temperature of the solder but below its recrystallization temperature. In methods according to this aspect of the invention, the solder masses incorporate columnar inclusions, which are present when the solder masses are stretched. As used in this disclosure, the term "columnar inclusion" refers to a separate phase within the solder present as elongated droplets or particles. For example, the moving step may be performed at least in part at a temperature between the solidus and liquidus temperatures of the solder masses, and the columnar inclusions may be present as solid inclusions within the partially molten solder masses during the moving step. Such columnar inclusions will be formed, for example, by lead-tin alloy solders containing about one percent to about five percent copper by weight. As the solder masses are stretched during the moving step, the columnar inclusions tend to orient preferentially in the direction of movement, and hence orient along the long axis of the elongated solder masses resulting from the moving step. Columnar inclusions further enhance resistance of the elongated solder masses to fatigue failure.

A method according to a further aspect of the invention includes the step of providing first and second elements with pairs of pads as aforesaid, and with solder masses at at least some pairs such that each solder mass is in contact with both pads of the associated pad. Methods according to this aspect of the invention include the further step of moving the elements relative to one another, while the solder masses are at a temperature above the recrystallization temperature of the solder, so that the elements move relative to one another in a horizontal direction parallel to the confronting surfaces so as to deform the solder masses in the horizontal direction. Desirably, the method also includes the step of moving the elements away from one another in a vertical direction, transverse to the confronting surfaces while the solder masses are at a temperature above the recrystallization temperature. Most preferably, the vertical and horizontal movements are performed simultaneously. The pads constituting each pair may be aligned one above the other prior to the horizontal movement and may be offset from one another in the horizontal direction after the horizontal movement step. Methods according to this aspect of the invention yield assemblies incorporating elongated solder masses having directions of elongation which are inclined to the confronting surfaces of the components. The sloping, elongated solder masses provide enhanced flexibility in the assembly.

In the most preferred processes according to the invention, the foregoing aspects of the invention are combined in a single assembly process.

Yet another aspect of the invention provides packaged microelectronic elements such as semiconductor chips. A packaged microelectronic element according to this aspect of the invention includes a microelectronic element such as a semiconductor chip together with an interposer overlying the contact-bearing surface of the chip. The interposer desirably is a flexible sheetlike element and includes an interior surface facing toward the chip and pads on the interior surface. The interposer further includes terminals exposed for connection to external components. The terminals may be exposed at an exterior surface of the interposer, facing away from the chip. The terminals are electrically connected to the pads over the interposer. The pads of the interposer in turn are electrically connected to the pads of the microelectronic element to a semiconductor chip by elongated solder masses extending between the pads of the interposer and the pads of the micro electronic element chip. Most desirably, the assembly includes a compliant dielectric layer such as a gel, foam or elastomer surrounding the elongated solder masses. Such an assembly can be handled and the amount of using standard surface mounting techniques, as by solder bonding the terminals of the interposer to a circuit panel or other substrate. After assembly, flexure of the elongated solder masses provides compensation for differential thermal expansion, and relieves stress on the bonds between the terminals and the circuit panel.

Yet another aspect of the invention provides a soldered assembly, such as a packaged microelectronic element or other assembly which includes first and second elements with pairs of pads thereon and which includes solder masses, each such solder mass extending between the pads of one such pair. The solder masses incorporate columnar inclusions. Most preferably, the columnar inclusions in at least some of the solder masses are oriented preferentially in the direction between the pads of the associated pair. That is, the lengthwise direction of the columnar inclusions is preferentially oriented in alignment with the direction between the pads. Yet a further aspect of the invention provides solder assemblies with elongated solder masses extending between pairs of pads on opposing surfaces of two elements. The pads of each pair are spaced apart from one another in a vertical direction normal to the confronting surfaces of the element and are offset from one another in a horizontal direction parallel to the confronting surfaces so that the elongated solder masses extend oblique to the vertical and horizontal directions, and oblique to the surfaces of the opposing elements. Most desirably, the elongated solder masses extend generally parallel to one another. The oblique orientation of the elongated solder masses provides enhanced flexibility and fatigue resistance. Here again, the various aspects of the invention can be combined with one another to form an assembly, such as a packaged chip, which includes all of the features discussed above with reference to the assembly.

These and other objects, features and advantages of the present invention will be more readily apparent from the detailed description of the preferred embodiments set forth below, taken in conjunction with the accompanying drawings.

DETAILED DESCRIPTION OF THE PREFERRED EMBODIMENTS

Figure 1:
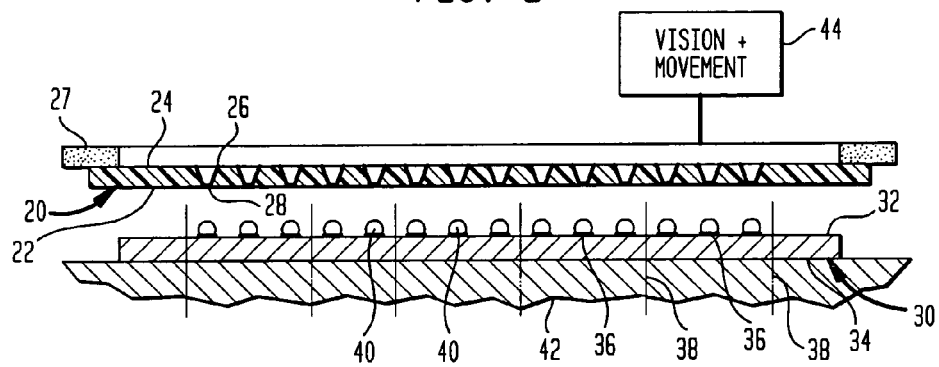
FIG. 1 is a diagrammatic sectional view depicting components during a stage of a process in accordance with one embodiment of the invention.

A process in accordance with one embodiment of the invention utilizes a flexible dielectric sheet 20 having oppositely facing inner surface 22 and outer surface 24. Sheet 20 may be formed from the polymeric materials such as a polyimide. The thickness of sheet 20 is greatly exaggerated in FIG. 1 for clarity of illustration. Typically, sheet 20 is about 25–100 μm thick. Sheet 20 has numerous holes extending through it. These holes are provided with metallic via liners 26. Each via liner defines a pad 28 on the inner surface 22 of the sheet. Each via liner is also exposed at the outer surface 24 of the sheet. Sheet 20 is attached to a ring-like frame 27 formed from a rigid material. The sheet may be stretched on the frame in the manner disclosed in U.S. Pat. No. 5,518,964, the disclosure of which is hereby incorporated by reference herein and in the manner discussed in co-pending, commonly assigned U.S. Provisional Patent Application No. 60/061,932 filed Oct. 17, 1997, the disclosure of which is also incorporated by reference herein. As described in such patent and patent application, the use of a frame to hold the sheet taut helps to maintain precise positioning of the metallic via liners and pads 28 relative to one another. The features of sheet 20, such as the holes and via-liners can be formed by generally conventional techniques, such as by laser ablation of the holes and additive or subtractive plating to form the metallic features. Desirably, the holes and pads are formed while the sheet is held taut on frame 27.

The process, according to this embodiment of the invention, also utilizes a semiconductor wafer 30 having oppositely facing front and rear surfaces 32 and 34 and having numerous contact pads 36 on the front surface. The wafer incorporates a large number of semiconductor chips formed integrally with one another. The boundaries between adjacent chips are schematically indicated by planes 38 in FIG. 1. Each of the chips incorporates internal electronic components (not shown) which are electrically connected to the overlying contact pads 36. The chip also includes a conventional passivation layer (not shown) on front surface 32, which covers the entire front surface except at contact pads 36. Although only a few contact pads 36 of the wafer and a corresponding few contact pads 28 of sheet 20 are illustrated in FIG. 1, it should be appreciated that the wafer typically has thousands, tens of thousands or even hundreds of thousands of contact pads and the sheet has a corresponding number of contact pads distributed at spacings corresponding to the spacings of the contact pads on the wafer.

Solder masses 40 are provided on the contact pads 36 of the wafer. These solder masses may be solder balls formed from a lead-tin solder, desirably a high lead solder such as 95% lead 5% tin. The size of the solder balls will depend upon the size of the contact pads, the spacing between adjacent contact pads, and the desired spacing between the chip and the dielectric sheet. For typical applications, the solder balls may be between about 50 and about 250 μm in diameter. The solder balls may be applied using generally conventional processes as, for example, by placing a stencil having openings corresponding to the contact pads of the wafer over the front surface of the wafer and distributing the solder balls over the surface of the stencil so that a solder ball is deposited onto each contact pad of the wafer. Desirably, a flux (not shown) is provided on the contact pads, typically by applying the flux selectively, as by stenciling or silk screening onto the pads. Typically, the flux is applied before the solder balls are placed. The flux may serve to physically anchor the solder balls in position on the wafer prior to the next processing step. The wafer may also be heated so as to partially or completely melt the solder and form metallurgical bonds between the solder masses and the individual contact pads. The solder does not wet the passivation layer or the other materials of the wafer and hence, does not flow between contact pads. Flux may be removed from the assembly at this stage of the process by washing wafer with a suitable solvent.

Figure 2:
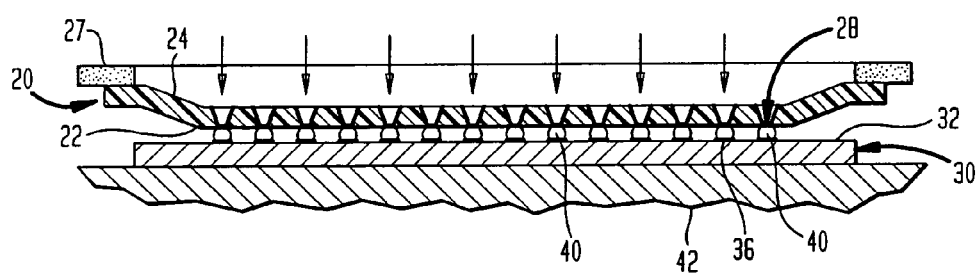
FIGS. 2, 3 and 4 are views similar to FIG. 1, but depicting the components during progressively later stages of the process.

The wafer, with the solder masses 40 thereon and the flexible sheet 20 are juxtaposed as depicted in FIG. 1, so that the front surface 32 of the wafer with the contact pads and solder masses thereon confronts the inner surface 22 of sheet 20. The wafer is held on a lower fixture 42. The sheet is engaged with an alignment system such as a machine-vision system 44, adapted to register features on the sheet and on the wafer and to move frame 27 and sheet 20 in horizontal directions, parallel to the surfaces of the sheet, so as to bring the contact pads 28 into alignment with the contact pads 36 of the wafer. Alternatively, the sheet may be aligned with the wafer by mechanical engagement between features of frame 27 such as alignment pins or holes (not shown) and mating features on the fixture holding the wafer. While the sheet is maintained in alignment with the wafer, the sheet is biased downwardly as depicted in FIG. 2, as by applying air or other fluid under atmospheric pressure to the exterior surface 24, or by engaging a resilient element such as an elastomeric pad (not shown) to the exterior surface, so as to urge the contact pads 28 into engagement with solder masses 40. The vertical deflection of the sheet relative to frame 27 is greatly exaggerated in FIG. 2. The extent of such vertical deflection, for example, may be slightly larger than the differences in the height of the individual solder masses 40, which in turn depends on factors such as the diameter tolerance of the solder balls. This tolerance typically is less than +20 μm. Alternatively or additionally, frame 27 may be biased downwardly towards lower fixture 42 and wafer 30 by a fixture (not shown). While the contact pads 28 on sheet 20 are engaged with the solder balls 40, the solder balls are brought to a temperature above their solidus temperature so as to melt or partially melt the solder and allow the solder to wet the contact pads 28. The assembly may be maintained under vacuum and/or under a reducing atmosphere to prevent oxides from interfering with the wetting process. Here again the solder wets only the individual contact pads and does not wet the surfaces of the polymeric sheet. Flux may optionally be provided on contact pads 28 prior to engagement of the sheet with the wafer. Once the solder has wet the contact pads of the sheet, each solder mass 40 is engaged with and in contact with a pair of pads including one pad 28 on the sheet and another pad 36 on the wafer.

Figure 3:
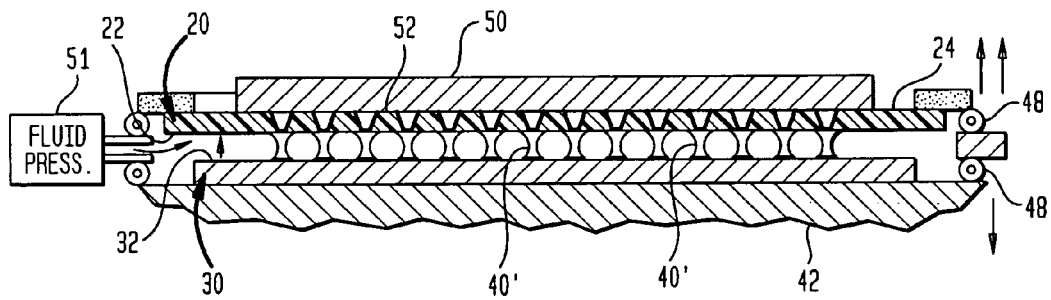
Figure 4:
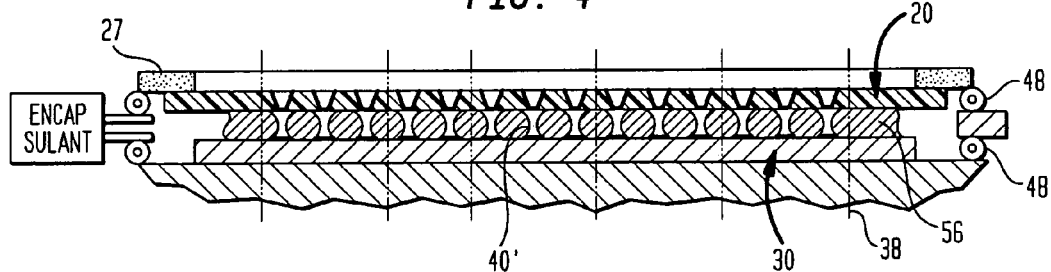

While the solder remains in contact with the pads of the sheet and wafer, a fluid, which may be a gas or a liquid, is injected under pressure, between the confronting surfaces 22 and 32 of sheet 20 and wafer 30, as depicted in FIG. 3. During this step, flexible seals 48, such as hollow metallic o-rings, bellows or the like are engaged between frame 27 and lower platen 42. Alternatively, these seals may be engaged between the sheet and the wafer, or between the sheet and the lower platen or engaged in any other manner which seals off the space between the sheet and the wafer from the surroundings, but which permits the sheet to move relative to the wafer. Also, an upper fixture 50 having a planar lower face 52 may be disposed above sheet 20 inside the opening of frame 27. Upper fixture 50 is held at a fixed position relative to lower fixture 42 and thus at a fixed position relative to wafer 30.

The fluid is introduced from a conventional pressure source 51 such as a pressurized gas cylinder or pump with an appropriate regulator. Desirably, the fluid is selected so that is in inert with respect to the solder and the materials constituting the sheet and wafer at the temperatures used in the process. Among the gases which can be employed are the noble gases such as helium and argon, nitrogen, as well as inert fluorocarbons. Because the fluid pressure between the confronting surfaces of the sheet and wafer exceeds the surrounding pressure on the outside of the assembly, the fluid pressure forces the sheet and wafer vertically away from one another. The vertical displacement is controlled by upper fixture 50. The upward displacement of the sheet stops when the upper surface 24 of the sheet engages the lower surface 52 of the fixture. During this movement, the solder masses 40 are stretched to form elongated solder columns 40'. The extent of such stretching is controlled by the amount of movement of the sheet. Typically, each solder mass is elongated by a distance about 50% to about 200% percent of the original diameter of the solder mass, so that the resulting elongated solder column has a length of about 150% to about 300% of the original diameter of the solder mass.

As the upper surface of the sheet is engaged with the planar lower surface 52 of fixture 50, the upper surface of the sheet is brought to a substantially planar configuration. Thus, where via liners or terminals 26 extend onto the top surface 24 of the sheet, the terminals may abut the bottom surface of fixture 50, so that all of the terminals are brought to a planar condition. Where the via-liners are recessed beneath the top surface, the polymeric surface itself may abut the bottom surface of the fixture.

During the movement or solder mass stretching, the solder masses are maintained at a temperature above the recrystallization temperature of the solder. As used in this disclosure, the term "recrystallization temperature" means a temperature at which the solder will undergo required plastic flow without introducing permanent fatigue or fracture of the solder. The recrystallization temperature is an absolute temperature at approximately two-thirds of the absolute solidus temperature. For conventional 60% lead, 40% tin solder, the recrystallization temperature is about 300 degrees Kelvin. The solder may be at higher temperatures, up to and above the liquidus temperature.

After the movement and solder stretching operation, a flowable liquid encapsulant 56 is injected between sheet 20 and wafer 30, so that the flowable liquid encapsulant surrounds the elongated solder columns 40'. The encapsulant is then cured to form dielectric materials surrounding and protecting the solder columns. Desirably, the dielectric is a compliant material such as an elastomer or gel. Other dielectric compositions may also be employed. The assembly may be maintained at an elevated temperature to accelerate curing of the encapsulant. The assembly may be maintained in the same fixture used for the solder-stretching operation during injection and curing of the encapsulant. Alternatively, the assembly may be placed in another fixture for encapsulant injection. The assembly may be maintained in a fixture during curing of the encapsulant. Alternatively, where the curing operation is conducted at a temperature below the solidus temperature of the solder or, preferably, below the recrystallization temperature of the solder, the assembly may be removed from the injection fixture and cured without fixturing. The solid solder columns 40' maintain the sheet in position relative to the wafer during the curing step.

Figure 5:
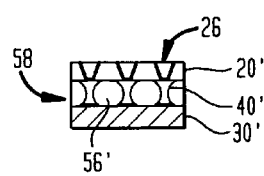
FIG. 5 is a diagrammatic sectional view of the packaged semiconductor chip resulting from the process of FIGS. 1–4.
Figure 6:
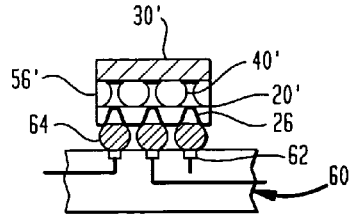
FIG. 6 is a diagrammatic view of the package semiconductor chip of FIG. 5 mounted to a circuit board.

Ring 27 is removed from sheet 20 before or after curing of the encapsulant. As disclosed in the aforementioned Provisional Patent Application No. 60/061,932, the ring may be removed from the sheet by applying radiation effective to degrade the adhesive used to hold the sheet on the ring. Where the ring is transparent to such radiation, the radiation may be applied through the ring. The sheet, wafer and encapsulant layer are then severed along scribe lines 38 so as to form individual unit assemblies 58 (FIG. 5). Each such unit assembly includes an individual semiconductor chip 30' together with a portion 20' of the flexible dielectric sheet and a compliant encapsulant layer 56'. Each such unit assembly includes terminals 26 connected to the contact pads 36 of chip by solder columns 40' disposed within encapsulant layer 56'. The packaged chip may be handled and mounted using conventional surface mount techniques. As seen in FIG. 6, the unit assembly or packaged chip may be mounted to circuit panel 60 using conventional surface mount solder techniques to bond the terminals 26 of the assembly on contact pads 62 of the circuit panel. Thus, solder masses 64 may be disposed between terminals 26 and contact pads 62 and reflowed so as to bond terminals 26 with contact pads 62. This reflow operation may be conducted at a temperature above or below the solidus temperature of the solder in columns 40'. If the reflow temperature used during the mounting procedure exceeds the solidus temperature of the solder in column 40', the encapsulant 56' will retain the solder columns in place.

In use of the completed circuit, differential thermal expansion of chip 30' relative to circuit panel 60 is taken up, in part, by flexure of solder columns 40'. Because the solder columns are elongated, they are more flexible than solder masses 64 at the interface between terminals 26 and the compact pads of the circuit panel. Therefore, the majority of the strain created by differential expansion and contraction of the components will be taken up by flexure of the solder columns 40'. The compliant encapsulant 56' mechanically decouples the dielectric element or interposer 201 from the chip 30' and facilitates flexure of the solder columns.

Figure 7:
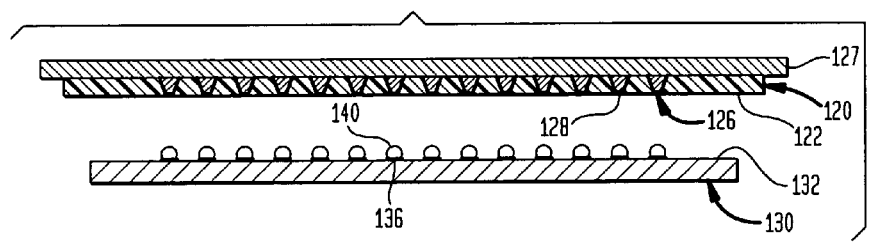
FIGS. 7, 8 and 9 are views similar to FIGS. 1–4 but depicting components during successive stages of a process in accordance with a further embodiment of the invention.
Figure 8:
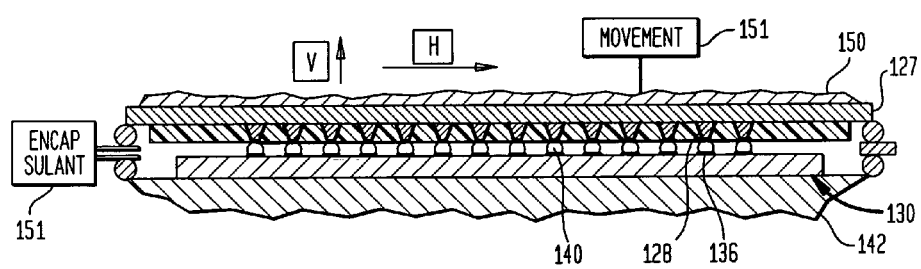
Figure 9:
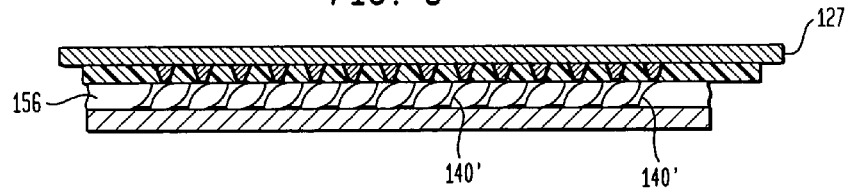

The process depicted in FIGS. 7–9 is generally similar to the process discussed above with reference to FIGS. 1–6. However, in the process of FIGS. 7–9, the dielectric sheet 120 is provided with a solid reinforcing element 127 which covers the exposed surface of the sheet, and which is electrically continuous with metallic via liners 126. Here again, the via liners extend through the sheet and then form contact pads 128 on the interior surface 120 of the sheet. Sheet 120 may be formed in place on reinforcing element 127. Reinforcing element 127 may be formed from a metal such as copper.

Here again, solder masses 140 are provided on the contact pads 136 of wafer 130. The sheet is juxtaposed with wafer 130 SO that the interior surface 120 of the sheet faces towards the contact bearing front surface 132 of the wafer 130, and the contact pads 128 on the interior surface of the electric sheet are brought into alignment with the corresponding contact pads 136 of the wafer. The sheet is engaged with the wafer so as to engage each contact pad 128 with the solder mass on the associated contact pad 136 of the wafer. In this condition, as depicted in FIG. 8, the pairs of contact pads 128 and 136 are substantially aligned with one another, and both contact pads of each pair in engagement with the solder mass 140 disposed between the pads as before. Reinforcing element 127 is engaged with a top fixture 150, whereas wafer 130 is engaged with a bottom fixture 142. Fixtures 142 and 150 are connected to a mechanical movement device 151. Movement device 151 may include any conventional device for moving elements relative to one another through controlled displacements as, for example, mechanical cams and/or linkages, electrically operated actuators and fluid operated actuators.

Figure 10:
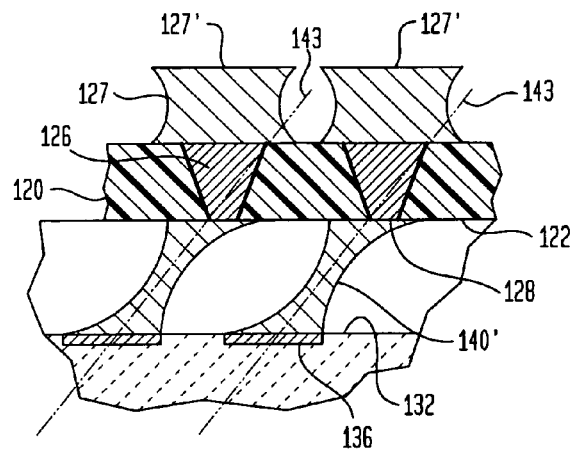
FIG. 10 is a fragmentary, diagrammatic sectional view on an enlarged scale depicting portions of the packaged semiconductor chip resulting from the process of FIGS. 7–9.

While the solder in masses 140 is at a temperature above the recrystallization temperature above the solder, movement device 151 is operated to move top fixture 150 and hence reinforcing element 127 and sheet 120 upwardly in a vertical direction indicated by arrow V perpendicular to the confronting surfaces of the sheet and wafer, and also in a horizontal direction H parallel to such confronting surfaces. This action stretches the solder masses both vertically and horizontally, thereby forming the solder masses into elongated, inclined solder bodies 140' as seen in FIGS. 9 and 10. Solder bodies 140' have their axes of elongation 143 (FIG. 10) oblique to the confronting surfaces 122 and 132 of the chip and wafer. Desirably, the axes of elongation of the solder bodies lie at an angle of about 60 to about 90 degrees to the planes of the confronting surfaces. Moreover, the axes of elongation above the solder bodies are substantially parallel to one another. In this condition, the contact pads 128 and 136 constituting each pair are displaced horizontally relative to one another.

During operation of the movement device, a curable liquid encapsulant is injected between the confronting surfaces of the sheet and wafer from a source 151. The pressure of the liquid encapsulant tends to force the sheet and wafer away from one another, so that the pressure of the encapsulant assists the movement device. The liquid encapsulant is cured to form a compliant layer as discussed above.

After the solder bodies 140' have solidified, and desirably after the encapsulant has been cured, the reinforcing element is etched selectively so as to remove the reinforcing element except at individual, spaced-apart locations overlying the via liners 126. The portions 127' of the reinforcing element remaining after such etching form terminals projecting from the exterior surface of sheet 120. As described in copending, commonly assigned U.S. patent applications Ser. No. 08/885,238, filed Jun. 30, 1997, Ser. No. 08/366,236, filed Dec. 29, 1994; and Ser. No. 08/989,312, filed Dec. 12, 1997, the disclosures of which are incorporated by reference herein, terminals formed from a solid metallic sheet can be provided with a "cooling tower" shape, such that each terminal tapers from a relatively broad base to a narrow section 127, and then flares outwardly to a broad tip having cross-sectional dimensions larger than the base. After curing of the compliant layer 156, and either before or after etching of the reinforcing element 127, the assembly is severed so as to provide individual unit assemblies as discussed above, each including one or more chips and the associated solder elements, terminals and pads.

Figure 11:
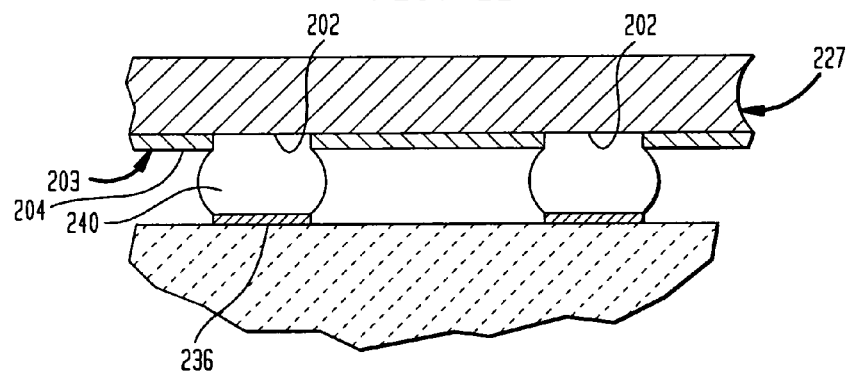
FIGS. 11 and 12 are fragmentary, diagrammatic sectional views depicting portions of components during successive stages of process in accordance with yet another embodiment of the invention.
Figure 12:
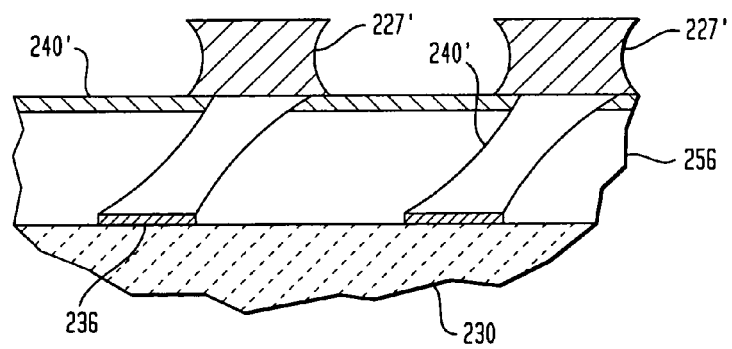

In a variant of this approach, dielectric sheet 120 is entirely omitted. Thus, one of the elements used in the process consists of a metallic layer 227 (FIG. 10) which has an interior surface 203 with solder-wettable pads 202 surrounded by a thin layer 204 of a non solder-wettable material such as nickel or other metal, a polymer or a nonmetallic material such as $SiO_2$. The solder masses 240 may be provided on the pads 236 of the wafer as discussed above, or on the pads 202 of the metallic element. Once again, the two elements are juxtaposed with one another and the solder is brought to a condition in which it contacts both pads, whereupon the elements are moved relative to one another to form elongated solder columns 240' (FIG. 11). A compliant layer 256 is formed between the confronting interior surfaces of the metal layer and the wafer by injecting and curing a liquid material as discussed above. After curing of the compliant layer, metal layer 227 is etched to form terminals 227' projecting from the compliant layer. The resulting structure has terminals 227' disposed at the distal ends of the elongated solder columns 240', i.e., at the ends of the columns remote from the wafer or second element. Non-wettable layer 204 may be removed in the regions between terminals 227' by a further etching process, leaving an assembly as shown in FIG. 11. Once again, the individual chips constituting the wafer may be severed from one another, to form unit assemblies or packaged chips each including one or more chips and the associated terminals.

Figure 13:
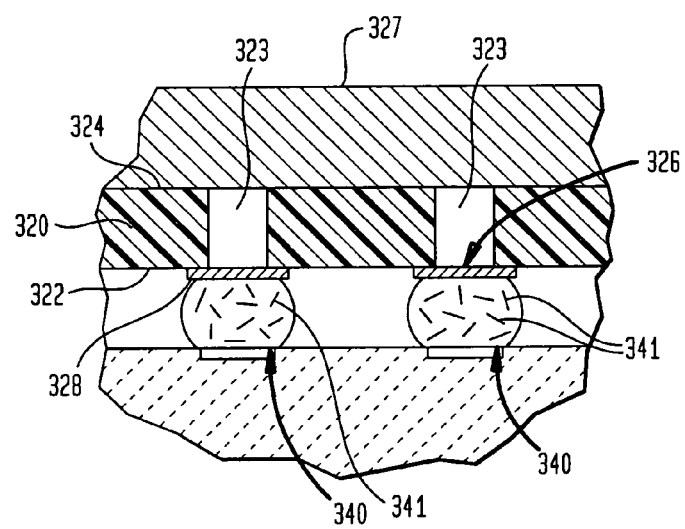
FIGS. 13 and 14 are fragmentary, diagrammatic sectional views depicting portions of components during successive stages of process in accordance with a further embodiment of the invention.
Figure 14:
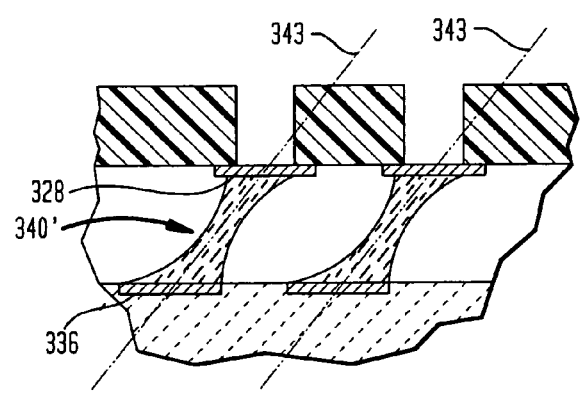

The process depicted in FIGS. 13 and 14 is similar to the process shown in FIGS. 7–10. However, the dielectric sheet 320 has metallic elements 327 which are disposed only on the interior surface 322 of the sheet. Each of these elements 327 defines a pad 328 facing inwardly (downwardly as seen in FIG. 13), as well as a terminal 326 facing outwardly (upwardly as seen in FIG. 13). Although terminals 326 are recessed relative to the outer surface 324 of the sheet, the terminals are exposed at such surface through vias 323 extending through the sheet.

The solder masses 340 are adapted to form columnar precipitates 341. In the condition shown in FIG. 13, the solder masses are at a temperature between the solidus and liquidus temperatures of the solder. The precipitates 341 are present as solid bodies in a surrounding liquid phase. For example, using a copper-bearing lead-tin solder, a sold copper-rich phase precipitates. When the elements are moved relative to one another to stretch the solder masses into elongated columns 340', the columnar precipitates 341 are oriented preferentially along the axes of elongation 343 of the columns. Without preferential orientation, with the precipitates in random arrangement, the average angle between the axes of elongation of the precipitates and the axis of elongation of the solder mass containing the precipitates would be 45°. With preferential orientation, this average angle is somewhat less than 45°. The oriented precipitates act as fiber reinforcements in the elongated columns.

Numerous variations and combinations of the features discussed above can be employed. For example, the dielectric packaging element can include one or more layers of traces extending along its surfaces or within the element, so that the packaging element can interconnect terminals and/or pads with one another. Thus, the packaging element can serve to interconnect different portions of the same chip or, where two or more chips or other microelectronic elements are mounted to the same packaging element, the packaging element can interconnect these elements with one another. The dielectric element may be rigid rather than flexible. Likewise, the dielectric layer formed from the encapsulant may be rigid rather than compliant. To enhance registration of the sheet and wafer, the reinforcing element used to reinforce the dielectric element may have a coefficient of thermal expansion selected to match the coefficient of thermal expansion of the wafer. For example, molybdenum or ceramic may be used as the reinforcing element. Such a CTE-matched reinforcing element may be provided as a frame, similar to that discussed above with reference to FIGS. 1–4, or as a plate overlying the top surface of the sheet as shown in FIGS. 7–9 and bonded to the top surface of the sheet, for example by an adhesive layer. After assembly, the plate is removed from the top surface, as by degrading the adhesive layer.

In the embodiments illustrated above, one of the elements is a unitary wafer including plural chips. However, other elements, such as assemblages of plural separate chips or other microelectronic elements, can be used in place of a wafer. Also, the process can be practiced using an individual chip or other device as one of the elements.

The entire soldering operation may be performed without flux, in a vacuum and/or inert atmosphere. Also, the solder masses can be provided on either element. Thus, the solder masses can initially wet the pads of the dielectric packaging element. When the sheet is juxtaposed with the wafer, the solder masses are engaged with the wafer and reflowed again into contact with the pads of the wafer.

As these and other variations and combinations of the features discussed above can be utilized without departing from the present invention as defined by the claims, the foregoing description of the preferred embodiments should be taken by way of illustration rather than by way of limitation of the invention as defined by the claims.

The invention claimed is:

1. A soldered assembly comprising:
   (a) first and second elements having confronting surfaces, pads on said confronting elements arranged in pairs, each such pair including a pad on the first element and a pad on the second element; and
   (b) solder masses associated with at least some of said pairs, each such solder mass being associated with the pads of one said pair and extending therebetween, said solder masses incorporating columnar inclusions dispersed therein, said columnar inclusions within at least one of said solder masses being oriented preferentially in the direction between the pads of the associated pair.

2. A soldered assembly as claimed in claim 1 wherein each said solder mass is elongated in the direction between the pads of the associated pair.

3. An assembly as claimed in claim 2 wherein the pads of each said pair are spaced apart from one another in a vertical direction normal to the confronting surfaces and offset from one another in a horizontal direction parallel to the confronting surfaces so that, said elongated solder masses extend oblique to said vertical and horizontal directions.

4. A soldered assembly as claimed in claim 1 wherein said solder masses consist essentially of a lead-tin solder with between about 1% and about 5% copper, and wherein said columnar inclusions constitute a copper-rich phase within said solder masses.

5. A soldered assembly as claimed in claim 1 wherein said columnar inclusions are formed as precipitates in said solder masses.

6. A soldered assembly comprising;
   (a) first and second elements having confronting surfaces, pads on said confronting elements arranged in pairs, each such pair including a pad on the first element and a pad on the second element; and
   (b) solder masses at at least some of said pairs, each such solder mass being associated with the pads of one said pair and extending therebetween, each said solder mass being elongated in the direction between the pads of the associated pair, the pads of each said pair being spaced apart from one another in a vertical direction normal to the confronting surfaces, the pad of each said pair on said first element being offset from the pad of that pair on the second element in a horizontal offset direction parallel to the confronting surfaces so that said elongated solder masses extend oblique to said vertical and horizontal directions, said offset directions of all of said pairs being the same so that all of said elongated solder masses slope in the same direction.

* * * * *

UNITED STATES PATENT AND TRADEMARK OFFICE
CERTIFICATE OF CORRECTION

| | |
|---|---|
| PATENT NO. | : 7,078,819 B2 |
| APPLICATION NO. | : 09/854269 |
| DATED | : July 18, 2006 |
| INVENTOR(S) | : Thomas H. DiStefano |

Page 1 of 1

It is certified that error appears in the above-identified patent and that said Letters Patent is hereby corrected as shown below:

On the cover:
In the Abstract, line 6, "but provides thermal" should read -- but can provide thermal --.

Column 1, lines 65-66, "interfaces with the contact pads, produce" should read -- interface with the contact pads, producing --.
Column 2, line 47, "as a" should read -- as an --.
Column 3, line 5, "chip does not" should read -- chip do not --.
Column 3, line 24, "thereon provides" should read -- thereon, provides --.
Column 6, line 1, "and the amount of using" should read -- and mounted using --.
Column 7, line 26, "via-liners can" should read -- via-liners, can --.
Column 9, line 4, "that is in inert" should read -- that it is inert --.
Column 10, line 36, "interposer 201" should read -- interposer 20 --.
Column 10, line 51, "130 SO" should read -- 130 so --.
Column 14, line 2, "so that, said" should read -- so that said --.

Signed and Sealed this

Thirtieth Day of January, 2007

JON W. DUDAS
*Director of the United States Patent and Trademark Office*